(12) United States Patent
Kumagai et al.

(10) Patent No.: US 9,076,774 B2
(45) Date of Patent: Jul. 7, 2015

(54) SEMICONDUCTOR DEVICE AND A METHOD OF MANUFACTURING SAME

(71) Applicant: Hitachi Power Semiconductor Device, Ltd., Hitachi-shi, Ibaraki (JP)

(72) Inventors: Yukihiro Kumagai, Hitachinaka (JP); Michiaki Hiyoshi, Yokohama (JP)

(73) Assignee: Hitachi Power Semiconductor Device, Ltd., Hitachi-shi (JP)

( * ) Notice: Subject to any disclaimer, the term of this patent is extended or adjusted under 35 U.S.C. 154(b) by 0 days.

(21) Appl. No.: 13/894,756

(22) Filed: May 15, 2013

(65) Prior Publication Data

US 2013/0313711 A1 Nov. 28, 2013

(30) Foreign Application Priority Data

May 28, 2012 (JP) ................. 2012-120376

(51) Int. Cl.
*H01L 23/48* (2006.01)
*H01L 23/488* (2006.01)
(Continued)

(52) U.S. Cl.
CPC ........ *H01L 23/488* (2013.01); *H01L 21/02107* (2013.01); *H01L 23/047* (2013.01); *H01L 23/3735* (2013.01); *H01L 23/544* (2013.01); *H01L 24/29* (2013.01); *H01L 24/32* (2013.01); *H01L 24/83* (2013.01); *H01L 25/072* (2013.01); *H01L 2223/54406* (2013.01); *H01L 2223/54413* (2013.01); *H01L 2223/5442* (2013.01); *H01L 2223/54433* (2013.01); *H01L 2224/26175* (2013.01); *H01L 2224/291* (2013.01); *H01L 2224/32225* (2013.01); *H01L 2224/83447* (2013.01); *H01L 2224/83455* (2013.01); *H01L 2224/83815* (2013.01); *H01L 2924/3512* (2013.01); *H01L 2924/13055* (2013.01); *H01L 2223/54486* (2013.01); *H01L 23/498* (2013.01); *H01L 23/49844* (2013.01); *H01L 2924/1305* (2013.01)

(58) Field of Classification Search
USPC .......... 257/772, 779, 780, E23.023, E23.026, 257/E21.508
See application file for complete search history.

(56) References Cited

U.S. PATENT DOCUMENTS 6,707,152 B1 * 3/2004 Schrock ........................ 257/738
2008/0206928 A1     8/2008 Onishi et al.
2008/0237353 A1    10/2008 Lau et al.

FOREIGN PATENT DOCUMENTS

JP         8-31848 A     2/1996
JP     2000-332376 A    11/2000
(Continued)

OTHER PUBLICATIONS

European Search Report (13169401.0) dated Mar. 7, 2014, (14 pages).

*Primary Examiner* — Timor Karimy
(74) *Attorney, Agent, or Firm* — Crowell & Moring LLP

(57) ABSTRACT

In a semiconductor device where a metal circuit layer is disposed over a main planar surface of an insulating substrate, a semiconductor chip is connected by way of a solder over the metal circuit layer, and a metal wiring is connected over the metal circuit layer, in which a solder flow prevention area comprising a linear oxide material is formed between the semiconductor chip and the ultrasonic metal bonding region over the metal circuit layer.

4 Claims, 6 Drawing Sheets

(51) Int. Cl.
*H01L 21/02* (2006.01)
*H01L 23/373* (2006.01)
*H01L 23/544* (2006.01)
*H01L 25/07* (2006.01)
*H01L 23/047* (2006.01)
*H01L 23/00* (2006.01)
*H01L 23/498* (2006.01)

(56) References Cited

FOREIGN PATENT DOCUMENTS

| | | |
|---|---|---|
| JP | 2004-71888 A | 3/2004 |
| JP | 2011-165726 A | 8/2011 |
| WO | WO 2005/043966 A1 | 5/2005 |

* cited by examiner

SEMICONDUCTOR DEVICE AND A METHOD OF MANUFACTURING SAME

TECHNICAL FIELD

The present invention relates to a semiconductor device and particularly relates to a semiconductor device suitable to power application uses such as for motor control and a method of manufacturing the same.

BACKGROUND

Power semiconductor devices are semiconductor devices used for controlling electric equipment such as motors. With an increasing demand for energy saving and reduction in environmental loads in recent years, inverter control for motors has been developed and a demand for the power semiconductor devices has been increased rapidly along with development of markets for hybrid cars and electric cars.

In the power semiconductor device, a semiconductor chip for power control typically represented by IGBT (Insulated Gate Bipolar Transistor) or a rectifying diode chip is bonded by soldering over a metal circuit layer of a circuit substrate in which the metal circuit layer is formed over an insulating substrate. Then, a metal terminal such as made of copper (Cu) is bonded by means of ultrasonic metal bonding or a fine wire such as formed of aluminum (Al) or copper is bonded by wire bonding on one identical surface of the metal circuit layer where the chip and the solder are provided and connected directly or indirectly with a terminal of a casing of the power semiconductor device.

In the step of assembling such a power semiconductor device, if the processing temperature is excessively high, it causes a problem that not only the solder below the chip is melted and spreads from the inside to the outside of the chip failing to ensure sufficient thickness of the solder below the chip but also ultrasonic metal bonding or wire bonding can no more be attained if the solder spreads as far as the ultrasonic metal bonding portion or a wire bonding portion of the metal terminal.

The existent art for preventing the solder from flowing includes, for example, techniques disclosed in Japanese Unexamined Patent Application Publications Nos. 2004-71888 and Hei 08(1996)-31848. Japanese Unexamined Patent Application Publication No. 2004-71888 describes a semiconductor device in which grooves are formed over a circuit pattern by laser irradiation. Further, Japanese Unexamined Patent Application Publication No. Hei08(1996)-31848 describes a semiconductor device of heating the surface of a copper film selectively by a laser light thereby forming a copper oxide film.

SUMMARY

However, in the technique described in Japanese Unexamined Patent Application Publication No. 2004-71888, it is necessary to fabricate the upper corner of the groove to an acute angle in order to obtain a sufficient effect. However, since the upper corner of the groove is rounded by laser fabrication, it is not sufficient for preventing the solder from flowing.

Further, by the method described in Japanese Unexamined Patent Application Publication No. Hei 08(1996)-31848, since the copper oxide film is formed by heating the entire surface of regions other than the place where the chip or the terminal conductor is secured by scanning of laser light, it takes much time for performing laser scanning to result in a problem of lowering the productivity and increasing the cost.

The present invention has been achieved in view of the problems described above and it intends to provide a semiconductor device capable of effectively preventing solder below the chip from flowing at a reduced cost and with good productivity.

In the semiconductor device according to an aspect of the invention, a solder flow prevention area comprising an oxide material finely roughened at the surface is provided between a chip arranging region and an ultrasonic metal bonding region or a wire bonding region of a circuit substrate by laser irradiation.

Further, in the method of manufacturing a semiconductor device according to another aspect of the invention, a solder flow prevention area is formed by laser irradiation.

According to the aspects of the invention, since solder flow can be prevented, even when the chip and the ultrasonic metal bonding portion or the wire bonding portion are situated at a short distance due to high integration degree, a semiconductor device of high reliability with no occurrence of assembling failure can be obtained.

DETAILED DESCRIPTION OF THE PREFERRED EMBODIMENTS

Preferred embodiments of the present invention are to be described with reference to the drawings.

First Embodiment

A first embodiment of the invention is to be described with reference to FIG. 1 to FIG. 3.

Figure 1:
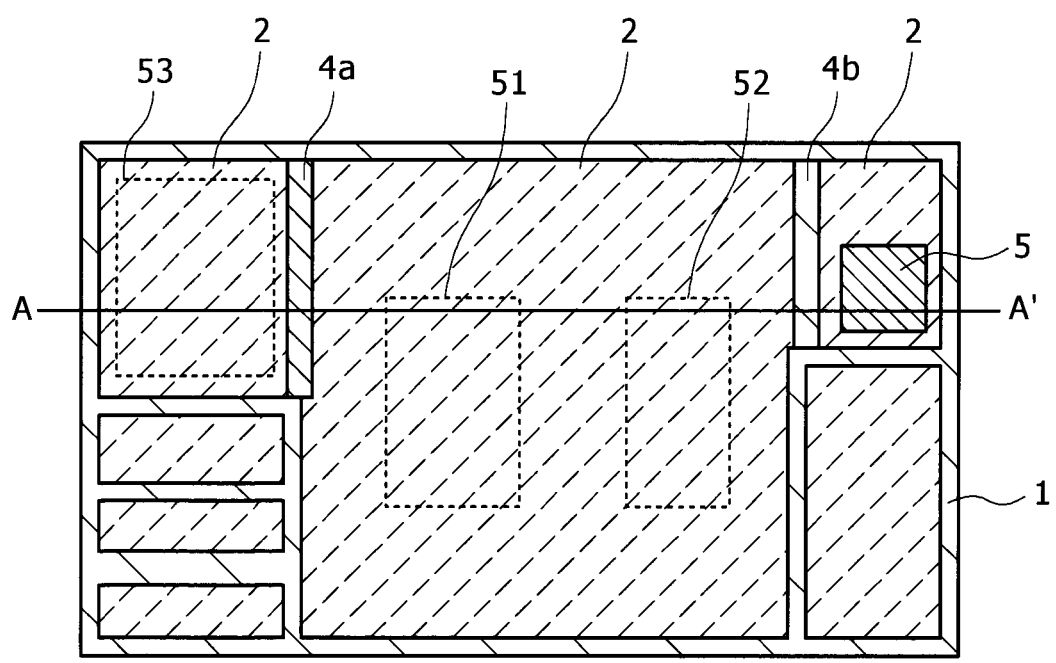
FIG. 1 is a schematic plan view of a circuit substrate of a semiconductor device according to a first embodiment.
Figure 2:
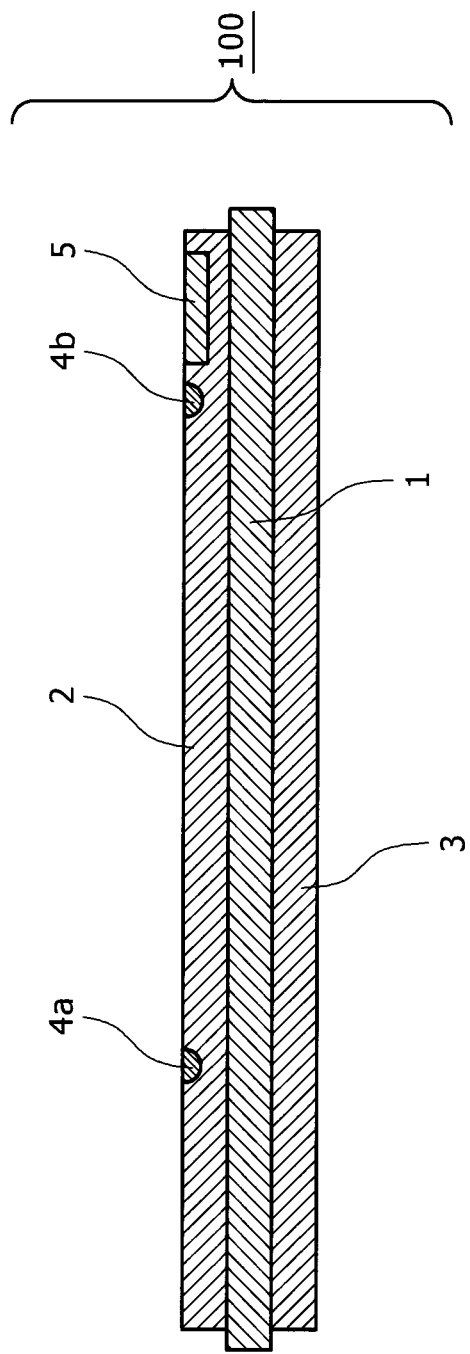
FIG. 2 is a schematic cross sectional view of the circuit substrate of the semiconductor device according to the first embodiment.
Figure 3:
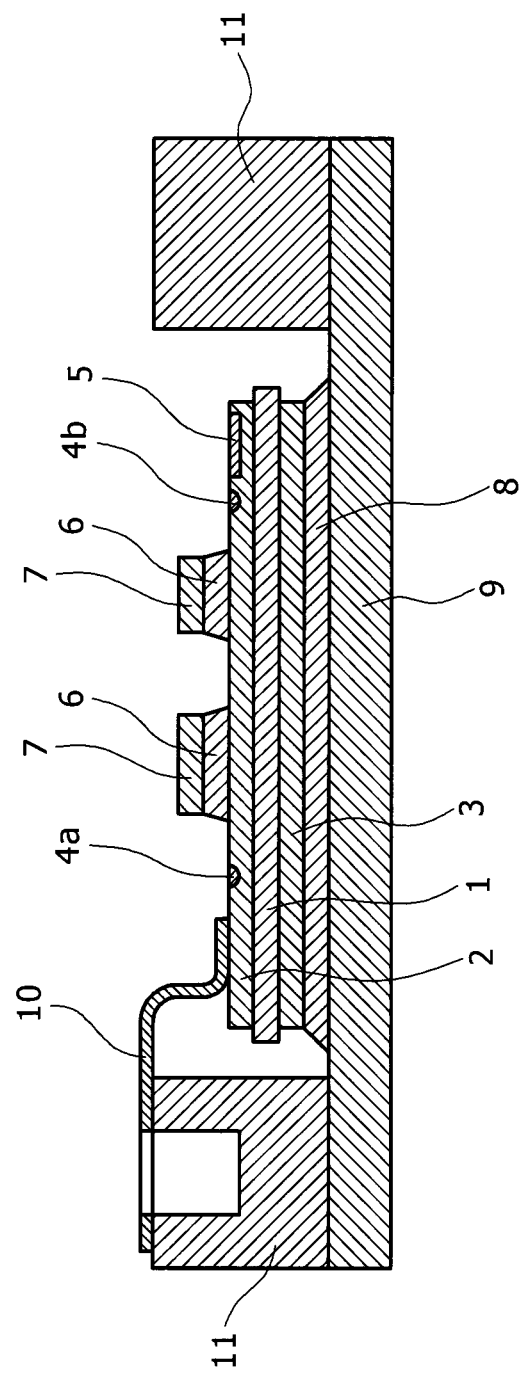
FIG. 3 is a schematic cross sectional view of the semiconductor device according to the first embodiment.

FIG. 1 is a schematic plan view illustrating a circuit substrate of a semiconductor device according to this embodiment, FIG. 2 is a schematic view illustrating a cross section along line A-A' in FIG. 1, and FIG. 3 is a schematic cross sectional view of the semiconductor device of this embodiment.

A circuit substrate 100 comprises an insulating substrate 1, and metal circuit layers 2 and 3 of a desired circuit pattern. The insulating substrate 1 comprises, for example, silicon nitride ($Si_3N_4$) aluminum nitride (AlN), and alumina ($Al_2O_3$). Further, the metal circuit layers 2 and 3 each comprise, for example, a copper thin film, a copper thin film plated with nickel (Ni), and an aluminum (Al) thin film plated with nickel (Ni).

A 2-dimensional bar code 5 is provided over the surface of the metal circuit layer 2. The 2-dimensional bar code 5 is marked on the surface of the metal circuit layer 2 by laser irradiation. The laser used for marking comprises, for example, a YVO4 laser but other lasers than that described above may also be used.

By the way, in the manufacture of semiconductor devices, hysteresis of inspection data for individual parts, etc. are administrated for product control. In the semiconductor devices in which parts are mounted on a casing, various conditions such as temperature in the assembling step and inspection data can be put to one-to-one correspondence to products by bonding a seal that describes product number to the case. In the same manner, while one-to-one correspondence is required in the step before mounting to the casing, that is, between individual parts and inspection data and assembling conditions also for the parts in which a chip, etc. are mounted over a circuit substrate as in this embodiment. According to the bar code used in this embodiment, hysteresis of assembling parts can be administrated even for parts in which the semiconductor chip, etc. are mounted over the circuit substrate.

Solder flow prevention areas 4a and 4b are present in a region of metal bonding a metal terminal 10 on the surface of a metal circuit layer 2 by ultrasonic waves, that is, between an ultrasonic metal bonding region 53 as a metal wiring connection portion and a chip arranging region 51 and between a 2-dimensional bar code 5 and a chip arranging region 52. The solder flow prevention areas 4a and 4b are formed linearly in the metal circuit layer 2 and comprise a finely surface-roughened metal oxide. The surface of the solder flow prevention area is roughened compared with the surface of the metal circuit layer 2, and the thickness of the oxide on the surface of the solder flow prevention area is larger than that on the surface of the metal circuit layer 2.

The metal oxide comprises, for example, copper oxide or, an oxide of a plating material, for example, a nickel oxide film when the metal circuit layer 2 is plated. A metal oxide less sensitive to reduction is more preferred. The solder flow prevention areas 4a and 4b are formed by laser irradiation to the surface of the metal circuit layer 2. The type of laser includes, for example, the YVO4 laser but other type of lasers may also be used. The finely roughened surface can be formed by using, for example, pulse laser. A semiconductor device of a low cost and at high productivity can be obtained by forming the solder flow prevention area and marking the 2-dimensional bar code by an identical laser irradiation device.

The width of the solder flow prevention area is preferably 0.01 mm or more and 0.1 mm or less, but the width may also be out of the range. It may suffice that the depth is less than the thickness of the metal circuit layer 2.

In the schematic cross sectional view illustrated in FIG. 3, a circuit substrate 100 in which a semiconductor chip 7 is connected by means of a solder 6 is mounted by the solder 8 to a metal base 9. A casing 11 is connected to the metal base 9 and a metal terminal 10 is connected by means of ultrasonic metal bonding to a predetermined position of the circuit substrate 100 by ultrasonic metal bonding (ultrasonic metal bonding region 53 in FIG. 1). As the semiconductor chip 7, an IGBT chip or a diode chip is applicable.

The function and the effect of this embodiment are to be described below.

Wettability of solder to a copper oxide or nickel oxide is less than that to copper or nickel. Further, since a larger surface area is available in a finely uneven surface than in a planar surface, the surface tension of solder can be increased. In this embodiment illustrated in FIG. 1, since the solder flow prevention areas 4a and 4b comprise copper oxide or nickel oxide in the finely roughened state, molten solder can be prevented from spreading. The solder flow prevention area may be provided optionally to a desired place. In this embodiment, the solder preventing area is provided between the ultrasonic metal bonding region 53 and the chip arranging region 51 and between the 2-dimensional bar code 5 and the chip arranging region 52. This can prevent the molten solder from spreading under wetting to the ultrasonic metal bonding region 51 and the 2-dimensional bar code 5. In addition to the configuration of this embodiment, the solder flow prevention area may be disposed, for example, also between the wire bonding connection region and the chip arranging region.

Further, according to the semiconductor device of this embodiment, the 2-dimensional bar code 5 is formed over the circuit substrate 100 by using a laser device for forming the solder flow prevention area. For example, identification number of an individual circuit substrate is registered in the 2-dimensional bar code. This can administrate the assembling data of parts such as chips mounted on the circuit substrate. Further, since the solder flow prevention area and the 2-dimensional bar code can be formed by using an identical laser irradiation device, cost for introducing the device can be saved.

The solder flow prevention areas 4a and 4b described in this embodiment are provided each by one row between the chip arranging region 51 and the metal bonding region 53 or the 2-dimensional bar code 5, but they may be arranged each in a plurality of rows. Even if a great amount of molten solder spreads under wetting, solder that overrides the first row can be prevented from spreading by the second and succeeding rows by using a plurality rows of solder flow prevention areas. The size of the width and the pitch of the solder flow prevention area when they are arranged in a plurality rows is preferably 0.01 mm or more and 0.1 mm or less of width and 0.01 mm or more and 0.1 mm or less of pitch, but the width and the pitch may be out of the range described above.

In the semiconductor device of this embodiment, the 2-dimensional bar code is marked to the circuit substrate, but other marks than the 2-dimensional bar code, for example, other symbols, letters, etc. may also be marked.

While the semiconductor device of this embodiment is intended for preventing solder below the semiconductor chip from flowing, this invention is also applicable to prevention of solder from flowing in connection of other electronic parts than the semiconductor chip, for example, a thermister which is connected by soldering.

Second Embodiment

Then, a second embodiment of the invention is to be described with reference to FIG. 4 to FIG. 6.

Figure 4:
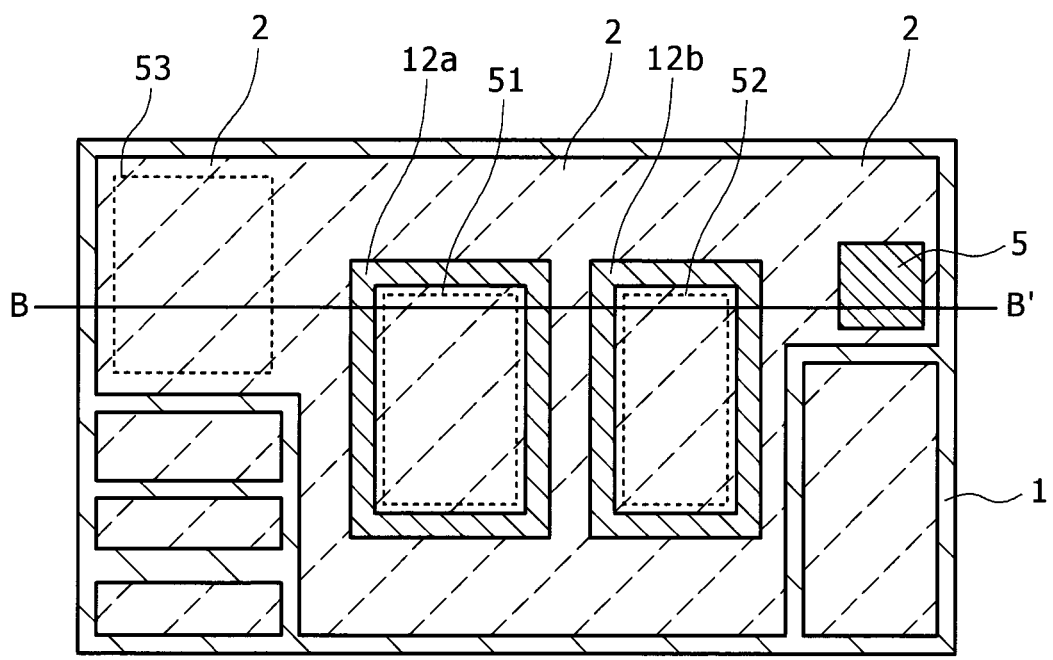
FIG. 4 is a schematic plan view of a circuit substrate of a semiconductor device according to a second embodiment.
Figure 5:
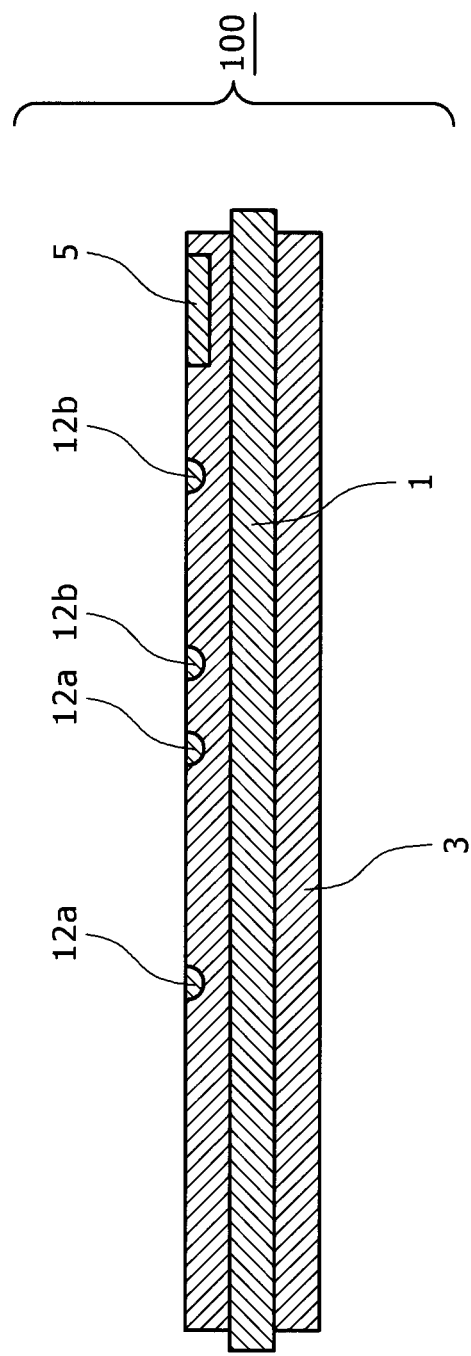
FIG. 5 is a schematic cross sectional view of the circuit substrate of the semiconductor device according to the second embodiment.
Figure 6:
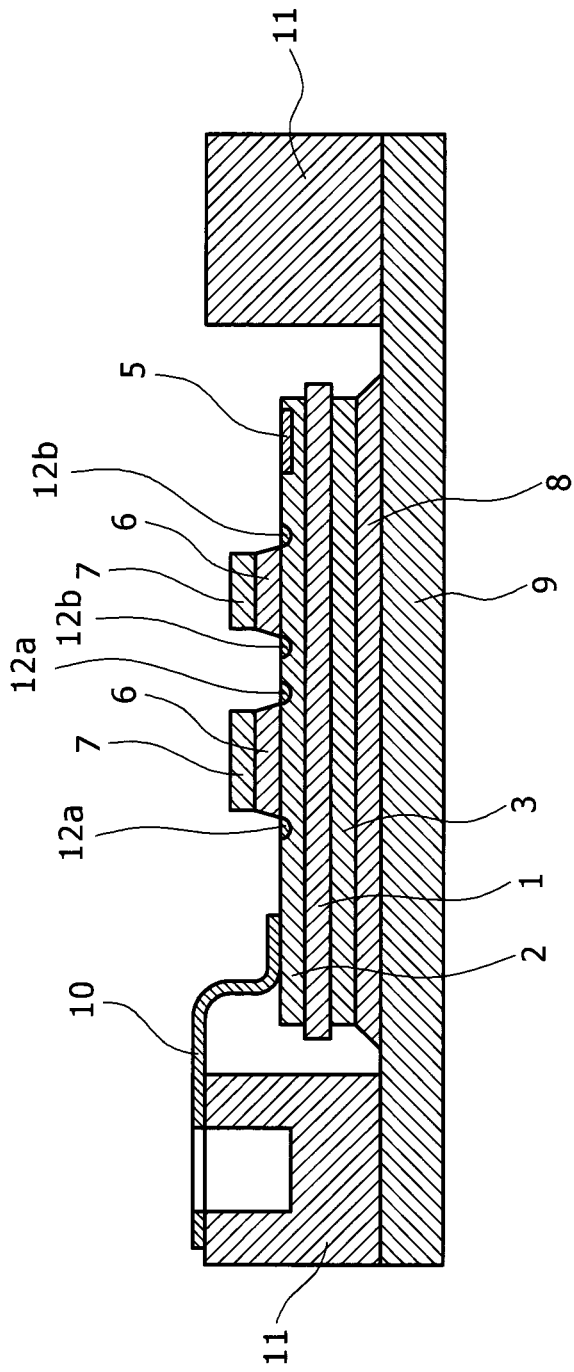
FIG. 6 is a schematic cross sectional view of the semiconductor device according to the second embodiment.

FIG. 4 is a schematic plan view illustrating a circuit substrate of a semiconductor device according to this embodiment, and FIG. 5 is a schematic view illustrating a cross section along line B-B' in FIG. 4. FIG. 6 is a schematic cross sectional view of the semiconductor device according to this embodiment.

This embodiment is different from the first embodiment in that solder flow prevention areas 12a and 12b surround chip arrangement regions 51 and 52.

According to the semiconductor device of this embodiment, the following function and effect can be obtained in addition to the function and effect shown in the first embodiment.

According to the semiconductor device of this embodiment, since spreading of solder under wetting can be reduced more than that of the first embodiment, decrease in the film thickness of solder below the chip can be prevented. This can prevent, development of fatigue crackings generated in solder below the chip.

In this embodiment, the solder flow prevention areas 12a and 12b surround the chip arranging regions 51 and 52 respectively, but a plurality of chip arranging regions may be surrounded also by one solder flow prevention area. Since this can shorten the time of laser irradiation, productivity can be improved.

In the same manner as in the first embodiment, the solver flow prevention area is not restricted to one row but may comprise a plurality of rows.

What is claimed is:

1. A semiconductor device in which a metal circuit layer is provided over a main planar surface of an insulating substrate, a semiconductor chip is soldered to the metal circuit layer, and a metal wiring connection portion is connected over the metal circuit layer,
   wherein a linear oxide material is formed in the metal circuit layer between the semiconductor chip and the metal wiring connection portion over the surface of the metal circuit layer.

2. The semiconductor device according to claim 1, wherein the surface of the oxide material is roughened more than the surface of the metal circuit layer.

3. The semiconductor device according to claim 1, wherein the oxide material is disposed so as to surround the semiconductor chip.

4. The semiconductor device according to claim 1, wherein a mark is formed to the metal circuit layer.

* * * * *